US 6,583,007 B1

(12) United States Patent
Eitan

(10) Patent No.: US 6,583,007 B1
(45) Date of Patent: Jun. 24, 2003

(54) REDUCING SECONDARY INJECTION EFFECTS

(75) Inventor: Boaz Eitan, Ra'anana (IL)

(73) Assignee: Saifun Semiconductors Ltd., Netanya (IL)

(*) Notice: Subject to any disclaimer, the term of this patent is extended or adjusted under 35 U.S.C. 154(b) by 0 days.

(21) Appl. No.: 10/023,278

(22) Filed: Dec. 20, 2001

(51) Int. Cl.$^7$ ............................................. H01L 21/336
(52) U.S. Cl. ...................... 438/257; 438/142; 438/316; 257/316; 257/324; 365/168; 365/185
(58) Field of Search ................. 438/257, 142, 438/316; 257/316, 324; 365/185, 168

(56) References Cited

U.S. PATENT DOCUMENTS

| | | | |
|---|---|---|---|
| 3,895,360 A | | 7/1975 | Cricchi et al. |
| 4,016,588 A | | 4/1977 | Ohya et al. |
| 4,017,888 A | | 4/1977 | Christie et al. |
| 4,145,703 A | * | 3/1979 | Blanchard et al. ............ 357/55 |
| 4,151,021 A | | 4/1979 | McElroy |
| 4,173,766 A | | 11/1979 | Hayes |
| 4,173,791 A | | 11/1979 | Bell |
| 4,257,832 A | | 3/1981 | Schwabe et al. |
| 4,306,353 A | | 12/1981 | Jacobs et al. |
| 4,342,149 A | | 8/1982 | Jacobs et al. |
| 4,360,900 A | | 11/1982 | Bate |
| 4,380,057 A | | 4/1983 | Kotecha et al. |
| 4,448,400 A | * | 5/1984 | Harari ......................... 365/185 |
| 4,471,373 A | | 9/1984 | Shimizu et al. |
| 4,521,796 A | | 6/1985 | Rajkanan et al. |
| 4,527,257 A | | 7/1985 | Cricchi |
| 4,630,085 A | | 12/1986 | Koyama |
| 4,667,217 A | | 5/1987 | Janning |
| 4,742,491 A | | 5/1988 | Liang et al. |
| 4,769,340 A | | 9/1988 | Chang et al. |
| 4,780,424 A | | 10/1988 | Holler et al. |
| 4,847,808 A | | 7/1989 | Kobatake |

(List continued on next page.)

FOREIGN PATENT DOCUMENTS

| | | |
|---|---|---|
| EP | 0751560 | 1/1997 |
| EP | 1073120 | 1/2001 |
| GB | 1297899 | 11/1972 |
| GB | 2157489 | 10/1985 |
| JP | 05021758 | 1/1993 |
| JP | 07193151 | 7/1995 |
| JP | 09162314 | 6/1997 |
| WO | WO 81/00790 | 3/1981 |
| WO | WO 96/25741 | 8/1996 |

OTHER PUBLICATIONS

U.S. patent application Ser. No. 08/902,890, Eitan, filed May 4, 2000.
U.S. patent application Ser. No. 08/905,286, Eitan, filed Jul. 30, 1997.
U.S. patent application Ser. No. 09/082,280, Eitan, filed May 20, 1998.
U.S. patent appplciation Ser. No. 09/348,720, Eitan, filed Jul. 6, 1999.
U.S. patent application Ser. No. 09/413,408, Eitan, filed Oct. 6, 1999.
U.S. patent application Ser. No. 09/519,745, Eitan, filed Mar. 6, 2000.

(List continued on next page.)

Primary Examiner—Michael S. Lebentritt
Assistant Examiner—Pho M. Luu
(74) Attorney, Agent, or Firm—Eitan, Pearl, Latzer & Cohen Zedek, LLP.

(57) ABSTRACT

A method for forming a non-volatile memory (NVM) device, the method including forming two diffusion areas in a substrate, said diffusion areas forming a channel therebetween, the channel being adapted to permit movement of primary electrons to at least one of the diffusion areas, forming a non-conducting charge trapping layer at least over the channel, and managing at least one of movement of secondary electrons from the substrate towards the charge trapping layer and a punch-through voltage in the substrate by controlling a position of a concentration of an electron acceptor dopant in the substrate.

18 Claims, 3 Drawing Sheets

U.S. PATENT DOCUMENTS

| | | |
|---|---|---|
| 4,870,470 A | 9/1989 | Bass, Jr. et al. |
| 4,941,028 A | 7/1990 | Chen et al. |
| 5,021,999 A | 6/1991 | Kohda et al. |
| 5,075,245 A | 12/1991 | Woo et al. |
| 5,086,325 A * | 2/1992 | Schumann et al. ........ 357/23.5 |
| 5,094,968 A * | 3/1992 | Schumann et al. ........... 437/43 |
| 5,104,819 A | 4/1992 | Freiberger et al. |
| 5,159,570 A | 10/1992 | Mitchell et al. |
| 5,168,334 A | 12/1992 | Mitchell et al. |
| 5,172,338 A | 12/1992 | Mehrotra et al. |
| 5,175,120 A | 12/1992 | Lee |
| 5,214,303 A | 5/1993 | Aoki |
| 5,260,593 A | 11/1993 | Lee |
| 5,305,262 A | 4/1994 | Yoneda |
| 5,311,049 A | 5/1994 | Tsuruta |
| 5,324,675 A | 6/1994 | Hayabuchi |
| 5,338,954 A | 8/1994 | Shimoji |
| 5,349,221 A | 9/1994 | Shimoji |
| 5,350,710 A | 9/1994 | Hong et al. |
| 5,359,554 A | 10/1994 | Odake et al. |
| 5,393,701 A | 2/1995 | Ko et al. |
| 5,394,355 A | 2/1995 | Uramoto et al. |
| 5,414,693 A | 5/1995 | Ma et al. |
| 5,418,176 A | 5/1995 | Yang et al. |
| 5,418,743 A | 5/1995 | Tomioka et al. |
| 5,422,844 A | 6/1995 | Wolstenholme et al. |
| 5,424,567 A | 6/1995 | Chen |
| 5,426,605 A | 6/1995 | Van Berkel et al. |
| 5,434,825 A | 7/1995 | Harari |
| 5,436,481 A | 7/1995 | Egawa et al. |
| 5,455,793 A | 10/1995 | Amin et al. |
| 5,467,308 A | 11/1995 | Chang et al. |
| 5,477,499 A | 12/1995 | Van Buskirk et al. |
| 5,496,753 A | 3/1996 | Sakurai et al. |
| 5,518,942 A | 5/1996 | Shrivastava |
| 5,523,251 A | 6/1996 | Hong |
| 5,553,018 A | 9/1996 | Wang et al. |
| 5,592,417 A | 1/1997 | Mirabel |
| 5,599,727 A | 2/1997 | Hakozaki et al. |
| 5,606,523 A | 2/1997 | Mirabel |
| 5,654,568 A | 8/1997 | Nakao |
| 5,656,513 A | 8/1997 | Wang et al. |
| 5,712,814 A | 1/1998 | Fratin et al. |
| 5,726,946 A | 3/1998 | Yamagata et al. |
| 5,751,037 A | 5/1998 | Aozasa et al. |
| 5,754,475 A | 5/1998 | Bill et al. |
| 5,760,445 A | 6/1998 | Diaz |
| 5,768,192 A | 6/1998 | Eitan |
| 5,787,036 A | 7/1998 | Okazawa |
| 5,793,079 A | 8/1998 | Georgescu et al. |
| 5,801,076 A | 9/1998 | Ghneim et al. |
| 5,812,449 A | 9/1998 | Song |
| 5,825,686 A | 10/1998 | Schmitt-Landsiedel et al. |
| 5,836,772 A | 11/1998 | Chang et al. |
| 5,841,700 A | 11/1998 | Chang |
| 5,847,441 A | 12/1998 | Cutter et al. |
| 5,864,164 A | 1/1999 | Wen |
| 5,870,335 A | 2/1999 | Khan et al. |
| 5,903,031 A | 5/1999 | Yamada et al. |
| 5,946,558 A | 8/1999 | Hsu |
| 5,963,412 A | 10/1999 | En |
| 5,973,373 A | 10/1999 | Krautschneider et al. |
| 5,991,202 A | 11/1999 | Derhacobian et al. |
| 6,011,725 A | 1/2000 | Eitan |
| 6,018,186 A | 1/2000 | Hsu |
| 6,020,241 A | 2/2000 | You et al. |
| 6,028,324 A | 2/2000 | Su et al. |
| 6,030,871 A | 2/2000 | Eitan |
| 6,034,403 A | 3/2000 | Wu |
| 6,034,896 A | 3/2000 | Ranaweera et al. |
| 6,063,666 A | 5/2000 | Chang et al. |
| 6,081,456 A | 6/2000 | Dadashev |
| 6,137,718 A | 10/2000 | Reisinger |
| 6,201,282 B1 | 3/2001 | Eitan |
| 6,348,711 B1 * | 2/2002 | Eitan .......................... 257/316 |

OTHER PUBLICATIONS

Chan et al., "A True Single–Transistor Oxide–Nitride–Oxide EEPROM Device," *IEEE Electron Device Letters*, vol. EDL–8, No. 3, Mar., 1987.

Chang, J., "Non Volatile Semiconductor Memory Devices," *Proceedings of the IEEE*, vol. 64 No. 7, pp. 1039–1059, Jul., 1976.

Eitan et al., "Hot–Electron Injection into the Oxide in n–Channel MOS Devices," *IEEE Transactions on Electron Devices*, vol. ED–28, No. 3, pp. 328–340, Mar. 1981.

Glasser et al., "The Design and Analysis of VLSI Circuits," Addison Wesley Publishing Co, Chapter 2, 1988.

Lee, H., "A New Approach For the Floating–Gate MOS NonVolatile Memory", *Applied Physics Letters*, vol. 31, No. 7, pp. 475–476, Oct. 1977.

Ma et al., "A dual–bit Split–Gate EEPROM (DSG) Cell in Contactless Array for Single–Vcc High Density Flash Memories," *IEEE*, pp. 3.5.1–3.5.4, 1994.

Ohshima et al., "Process and Device Technologies for 16Mbit Eproms with Large—Tilt—Angle implanted P–Pocket Cell," *IEEE*, CH2865–4/90/0000–0095, pp. 5.2.1–5.2.4, Dec., 1990.

Ricco, Bruno et al., "Nonvolatile Multilevel Memories for Digital Applications," *IEEE*, vol. 86, No. 12, pp. 2399–2421, Dec., 1998.

Roy, Anirban "Characterization and Modeling of Charge Trapping and Retention in Novel Multi–Dielectric Nonvolatile Semiconductor Memory Devices," Doctoral Dissertation, Sherman Fairchild Center, Department of Computer Science and Electrical Engineering, pp. 1–35, 1989.

"2 Bit/Cell EEPROM Cell Using Band–To–Band Tunneling For Data Read–Out," *IBM Technical Disclosure Bulletin*, U.S. IBM Corp. NY vol. 35, No. 4B, ISSN:0018–8689, pp. 136–140, Sep., 1992.

Tseng, Hsing–Huang et al., "Thin CVD Stacked Gate Dielectric for ULSI Technology", *IEEE*, 0–7803–1450–6, pp. 321–324, 1993.

Pickar, K.A., "Ion Implantation in Silicon," *Applied Solid State Science*, vol. 5, R. Wolfe Edition, Academic Press, New York, pp. 151–249, 1975.

Bhattacharyya et al., "FET Gate Structure for Nonvolatile N–Channel Read–Mostly Memory Device," *IBM Technical Disclosure Bulletin*, U.S. IBM Corp. vol. 18, No. 6, p. 1768, Nov., 1975.

Bude et al., "EEPROM/Flash Sub 3.0 V Drain–Source Bias Hot carrier Writing", IEDM 95, pp. 989–992.

Bude et al., "Secondary Electron Flash—a High Performance, Low Power Flash Technology for 0.35 um and Below", IEDM 97, pp. 279–282.

Bude et al., "Modeling Nonequilibrium Hot Carrier Device Effects", Conference of Insulator Specialists of Europe, Sweden, Jun. 1997.

\* cited by examiner

REDUCING SECONDARY INJECTION EFFECTS

CROSS-REFERENCE TO RELATED APPLICATIONS

This application is related to U.S. Ser. No. 09/519,745, filed Mar. 6, 2000.

FIELD OF THE INVENTION

The present invention relates to electrically erasable, programmable read only memory (EEPROM) and nitride, programmable read only memory (NROM) cells in general, and particularly to reducing effects of secondary injection in NROM cells.

BACKGROUND OF THE INVENTION

Floating gate memory cells are used for electrically erasable programmable read only memory (EEPROM) and Flash EEPROM cells. Reference is now made to FIG. 1, which illustrates a typical prior art floating gate memory cell. The floating gate memory cell comprises source and drain portions S and D embedded in a substrate 5 between which is a channel 7. A floating gate 8 is located above but insulated from channel 7, and a gate 9 is located above but insulated from floating gate 8.

For most floating gate cells, the standard electron injection mechanism for programming is channel hot electron injection, in which the source to drain potential drop creates a lateral field that accelerates channel electron $e_1$ from source S to drain D, as indicated by arrow 6. Near drain D, the high energy electrons $e_1$ may be injected (arrow 4) into floating gate 8, provided that the gate voltage creates a sufficiently great vertical field.

There is another injection mechanism, known as secondary electron injection. As indicated by arrow 3, some of the channel electrons $e_1$ create hole and electron pairs through impact ionization of valence electrons in channel 7 or drain D. The probability of the ionization is denoted $M_1$ and it indicates the ratio between the channel current and the hole substrate current.

Due to the positive potential of drain D, generated electrons $e_2$ may be collected (arrow 11) by drain D. However, as indicated by arrow 13, holes $h_2$ may accelerate towards the low substrate potential of substrate 5. On the way, another impact ionization may occur, creating another electron-hole pair $e_3$-$h_3$ with probability $M_2$. Holes $h_3$ are pulled (arrow 15) further into substrate 5 and are no concern. However, electrons $e_3$, called secondary electrons, may be accelerated (arrow 17) towards positive gate 9 where, if they have gained sufficient energy, are injected into floating gate 8, this event having a probability of T.

The current for secondary injection is defined as:

$$I_S = I_{ds} * M_1 * M_2 T$$

wherein $I_{d3}$ is the channel current from source to drain.

Because this current is significant, some floating gate devices have been designed to enhance it, thereby reducing programming time and voltages.

The following articles discuss some possible methods to enhance secondary injection:

J. D. Bude et al., "Secondary Electron Flash—a High Performance, Low Power Flash Technology for 0.35 μm and Below", IEDM 97, pp. 279–282;

J. D. Bude et al., "EEPROM/Flash Sub 3.0 V Drain-Source Bias Hot Carrier Wiring", IEDM 95, pp. 989–992; and J. D. Bude and M. R. Pinto, "Modeling Nonequilibrium Hot Carrier Device Effects", Conference of Insulator Specialists of Europe, Sweden, June 1997.

These references discuss enhancing the secondary generation and injection generally by means of pocket implants of boron, which is an electron acceptor dopant, in the substrate 5. The pocket implants tend to enhance creation of the electron-hole pairs $e_3$-$h_3$, and thus increase the probability $M_2$.

However, secondary injection is not good for all types of memory cells. For nitride read only memory (NROM) cells, enhancing secondary injection may not enhance the operation of the cell and may be detrimental.

SUMMARY OF THE INVENTION

The present invention seeks to provide methods and apparatus for reducing effects of secondary injection in non-volatile memory (NVM) devices that have a non-conducting charge trapping layer, such as NROM devices. The reduction of the secondary injection improves endurance and reliability. The present invention also provides methods and apparatus for preventing punch-through voltages from detrimentally affecting erase operations in the NVM device that has a non-conducting charge trapping layer.

In the present invention, the probability T of secondary injection may be reduced by reducing the surface concentration of an electron acceptor dopant, such as, but not limited to, boron. Punch-through voltages in erase operations may be controlled by one or several methods. For example, using relatively high negative gate voltages (e.g., in the range of −5 to −7 V) and relatively low bit line (e.g., drain) voltages to erase the memory cell may reduce and suppress surface punch-through. Furthermore, undesirable punch-through currents may be reduced in the substrate by electron acceptor doping far from the gate-substrate interface (i.e., the substrate surface). The electron acceptor doping far from the gate-substrate interface reduces the probability T of secondary injection. The negative gate voltage in erase helps suppress the surface punch-through problem in erase, due to the reduced surface concentration of the electron acceptor dopant.

The surface concentration of the electron acceptor dopant may be reduced and the concentration increased far from the surface by one or several methods. For example, the substrate may be constructed with a double or triple-well process. Doping of the electron acceptor dopant may be constrained to be deep in the NROM cell well or at a medium depth. This may be accomplished, for example, by a deep pocket implant of the dopant. The surface concentration of the electron acceptor dopant may be reduced by doping the surface with an electron donor dopant, such as, but not limited to, phosphor or arsenic. Although the presence of the electron acceptor dopant deep in the subsume may not reduce the probability $M_2$ of creating electron-hole pairs $e_3$-$h_3$, nevertheless the distance of the dopant from the surface and far from the n+ junction may reduce the probability T of secondary injection, and reduce punch-through.

There is thus provided in accordance with a preferred embodiment of the present invention a method for forming a non-volatile memory (NVM) device, the method including forming two diffusion areas in a substrate, said diffusion areas forming a channel therebetween, the channel being adapted to permit movement of primary electrons to at least one of the diffusion areas, forming a non-conducting charge trapping layer at least over the channel, and managing at least one of movement of secondary electrons from the substrate towards the charge trapping layer and a punch-through voltage in the substrate by controlling a position of a concentration of an electron acceptor dopant in the substrate.

In accordance with a preferred embodiment of the present invention the managing includes concentrating less of the electron acceptor dopant generally near an upper surface of the substrate, the upper surface including an interface between the substrate and the charge trapping layer, and more of the electron acceptor dopant further from the upper surface of the substrate.

Further in accordance with a preferred embodiment of the present invention the managing includes concentrating most of the electron acceptor dopant generally between a position halfway from the upper surface and a lower surface of the substrate.

Still further in accordance with a preferred embodiment of the present invention the method includes constructing the substrate with at least one of a double-well and triple-well process.

In accordance with a preferred embodiment of the present invention less of the electron acceptor dopant may be concentrated generally near the upper surface of the substrate by concentrating more of an electron donor dopant near the upper surface of the substrate. The electron acceptor dopant may comprise boron. The electron donor dopant may comprise at least one of phosphor and arsenic.

Further in accordance with a preferred embodiment of the present invention the non-conducting charge trapping layer may include an oxide-nitride-oxide (ONO) layer. There is also provided in accordance with a preferred embodiment of the present invention a non-volatile memory (NVM) device including a channel formed in a substrate, two diffusion areas, one on either side of the channel in the substrate, each diffusion area having a junction with the channel, the channel being adapted to permit movement of primary electrons to at least one of the diffusion areas, a non-conducting charge trapping layer formed at least over the channel, and an electron acceptor dopant concentrated less near an upper surface of the substrate, the upper surface including an interface between the substrate and the charge trapping layer, and concentrated more further from the upper surface of the substrate.

In accordance with a preferred embodiment of the present invention the electron acceptor dopant is concentrated at at least $1 \times 1^{17}$ cm$^{-2}$ at a depth of 0.1 µm from the upper surface of the substrate.

In accordance with another preferred embodiment of the present invention the electron acceptor dopant is concentrated at at least $1 \times 10^{17}$ cm$^{-2}$ at a depth of between 0.1–0.8 µm and deeper from the upper surface of the substrate.

In accordance with yet another preferred embodiment of the preset invention the electron acceptor dopant is concentrated less than $1 \times 10^{17}$ cm$^{-2}$ at a depth of less than 0.1 µm.

BRIEF DESCRIPTION OF THE DRAWINGS

The present invention will be understood and appreciated more fully from the following detailed description taken in conjunction with the appended drawings in which.

DETAILED DESCRIPTION OF THE PRESENT INVENTION

Figure 2:
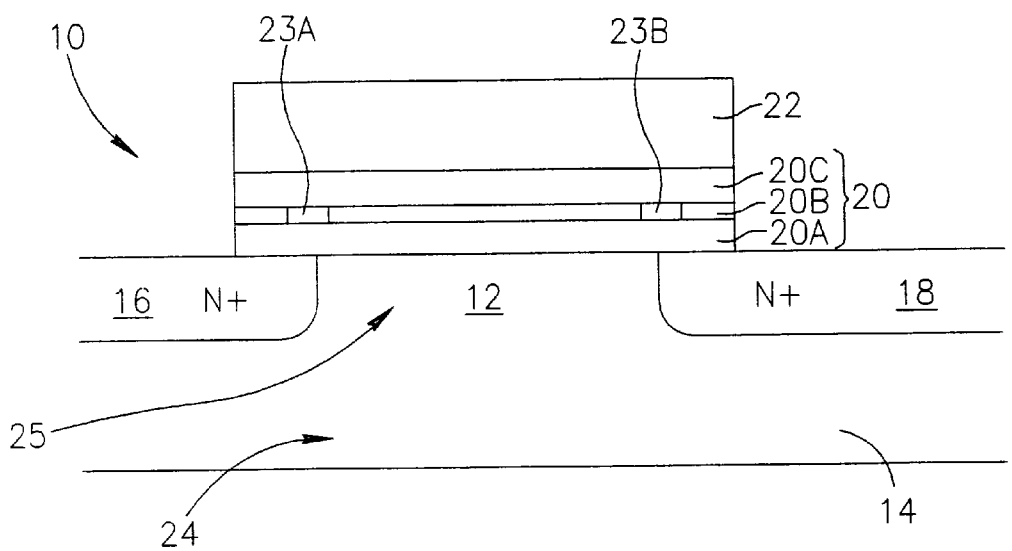
FIG. 2 is a simplified illustration of a non-volatile memory (NVM) device having a surface concentration adapted for reduced secondary injection, constructed and operative in accordance with an embodiment of the invention.

Reference is now made to FIG. 2, which illustrates a non-volatile memory (NVM) device 10, constructed and operative in accordance with an embodiment of the invention. The NVM device 10 has a non-conducting charge trapping layer, such as a nitride read only memory (NROM) device, as is now explained.

NVM device 10 preferably includes a channel 12 formed in a substrate 14. Two diffusion areas 16 and 18 are preferably formed on either side of channel 12 in substrate 14, each diffusion area having a junction with channel 12. A non-conducting charge trapping layer, such as, but not limited to, an oxide-nitride-oxide (ONO) layer 20 (i.e., a sandwich of an oxide sub-layer 20A, a nitride sub-layer 20B and an oxide sub-layer 20C) is preferably formed at least over channel 12, and a polysilicon gate 22 is preferably formed at least over ONO layer 20. NROM device 10 may comprise two separated and separately chargeable areas 23A and 23B in the nitride sub-layer 20B, each chargeable area defining and storing one bit.

In accordance with an embodiment of the invention, movement of secondary electrons from substrate 14 towards ONO layer 20 may be managed and may be reduced by controlling a concentration of an electron acceptor dopant in substrate 14. For example, reducing the presence of the electron acceptor dopant generally near an upper surface of substrate 14 (that is, near the interface between substrate 14 and oxide sublayer 20A of ONO layer 20) may significantly reduce secondary electron injection in the direction towards ONO layer 20 and polysilicon gate 22. The electron acceptor dopant may comprise, without limitation, boron.

Figure 1:
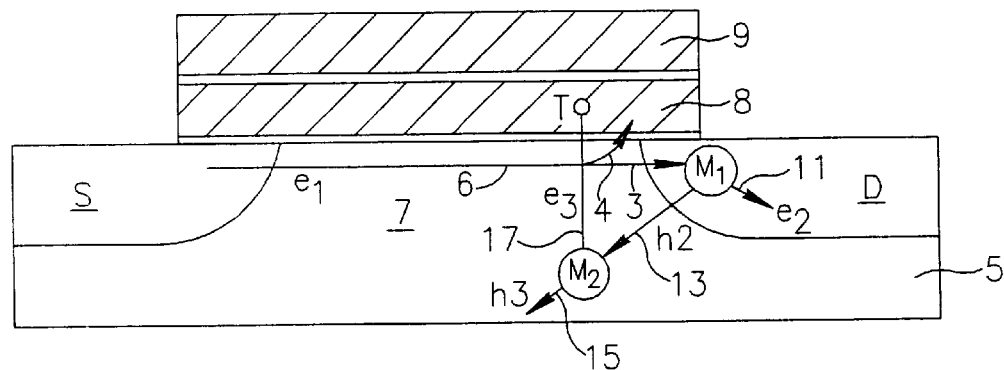
FIG. 1 is a simplified illustration of secondary injection in a prior art floating gate memory cell.

The surface concentration of the electron acceptor dopant may be reduced and the concentration increased far from the upper surface of substrate 14 by one or several methods. For example, substrate 14 may be constructed with a double or triple implant process. The electron acceptor dopant may be concentrated as a function of depth in the substrate of the NVM device 10, as is further described hereinbelow with reference to FIG. 3. Accordingly, the electron acceptor dopant may be doped by means of a deep or medium-depth pocket implant 24, as indicated generally in FIG. 2. The surface concentration of the electron acceptor dopant may be reduced by doping the surface with an electron donor dopant 25 (indicated generally in FIG. 2), such as, but not limited to, phosphor or arsenic. Although the presence of the electron acceptor dopant deep in the substrate 14 may not reduce the probability $M_2$ of creating electron-hole pairs $e_3$-$h_3$ (FIG. 1), nevertheless the distance of the dopant from the upper surface of substrate 14 and far from the n+ junctions 16 and 18 will reduce the probability T of secondary injection, and reduce punch-through.

Figure 3:
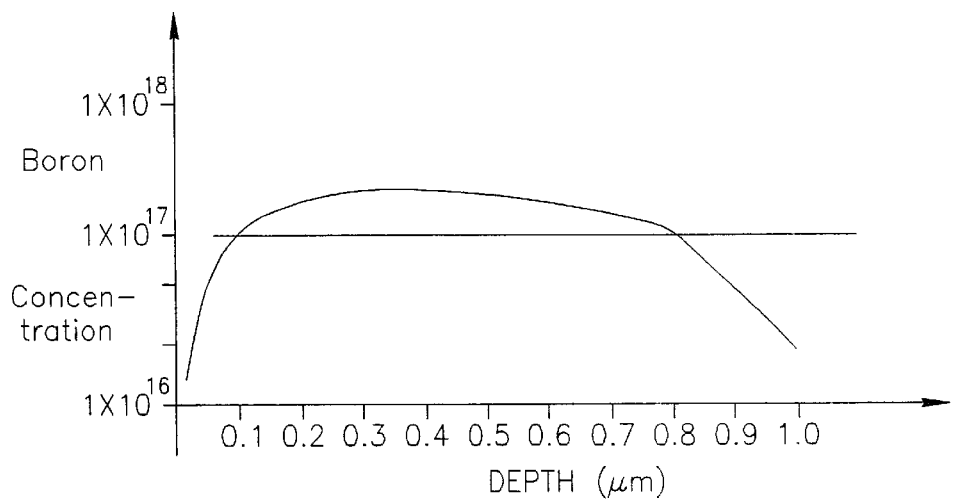
FIG. 3 is a simplified graphical illustration of a concentration of an electron acceptor dopant in terms of depth in the substrate of the NVM device of FIG. 2, in accordance with an embodiment of the invention.

Reference is now made to FIG. 3, which illustrates one example of a concentration of the electron acceptor dopant, e.g. boron, in terms of depth in the substrate of the NVM device 10. It is, however, emphasized that the invention is not limited to the concentration shown in FIG. 3. In FIG. 3, the boron is concentrated at at least $1 \times 10^{17}$ cm$^{-2}$ at a depth of 0.1 μm from the upper surface of the substrate 14 and deeper (for example, but not necessarily, to a depth of about 0.8 μm). At a depth of less than 0.1 μm, the boron concentration is less than $1 \times 10^{17}$ cm$^{-2}$.

The concentration of the electron acceptor dopant deep in the substrate 14 may reduce punch-through (which is generally undesirable in erase operations on the memory device) deep in the substrate 14. In one embodiment of the present invention, surface punch-through may be reduced in erase operations by using relatively high negative gate voltages (e.g., in the range of −5 to −7 V) and relatively low bit line (e.g., drain) voltages to erase the memory device.

Figure 4:
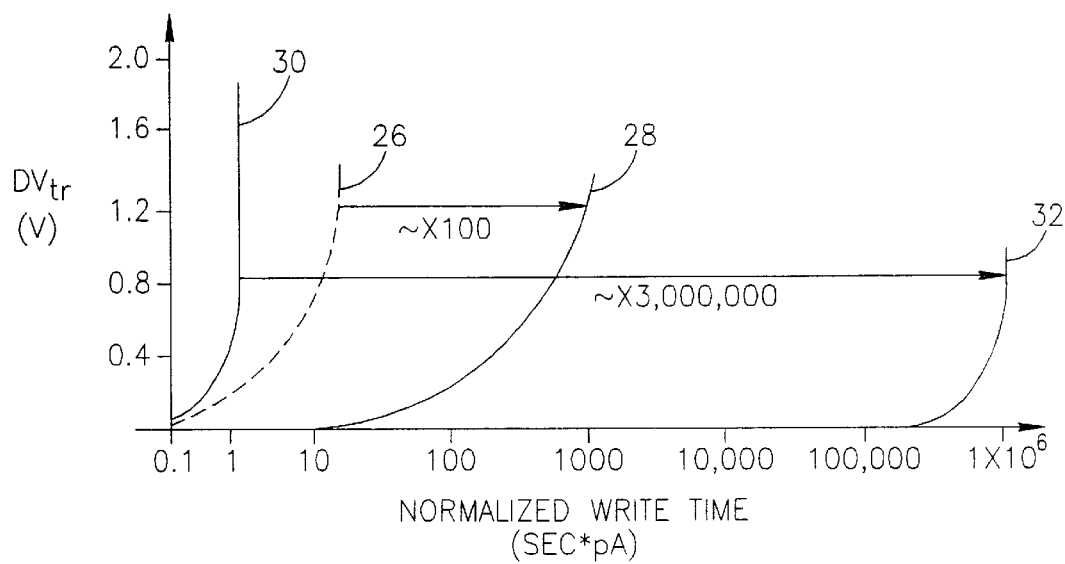
FIG. 4 is a simplified graphical illustration of an effect of reducing all electron acceptor dopant generally near the upper surface of the substrate of the NVM device of FIG. 2, as opposed to the presence of pocket or planar implants, on secondary injection of electrons, in accordance with an embodiment of the invention.
Figure 5:
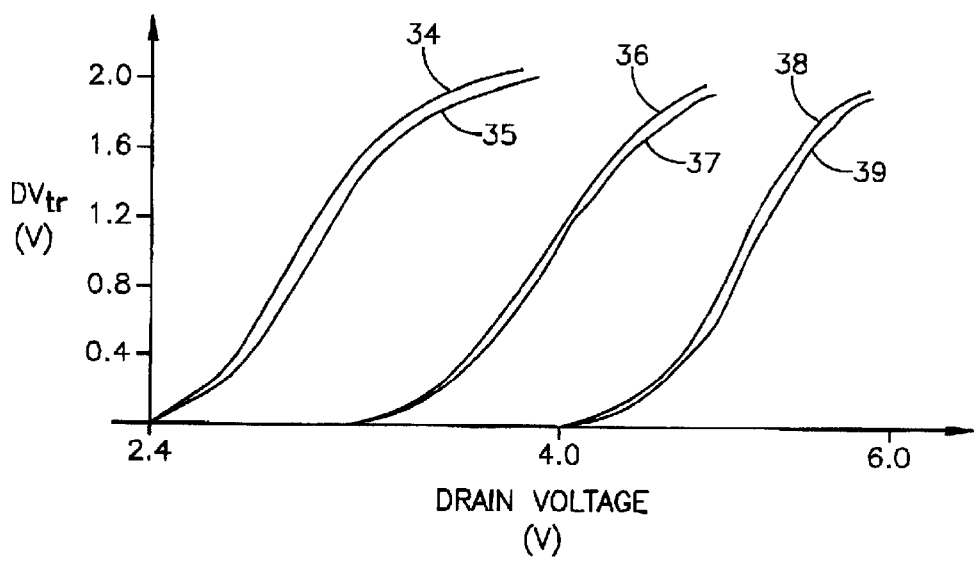
FIGS. 5 and 6 are simplified graphical illustrations of the effect of a concentration of the electron acceptor dopant deep in the substrate, such as deep in a double or triple well, respectively on programming and erasing, in accordance with an embodiment of the invention.
Figure 6:
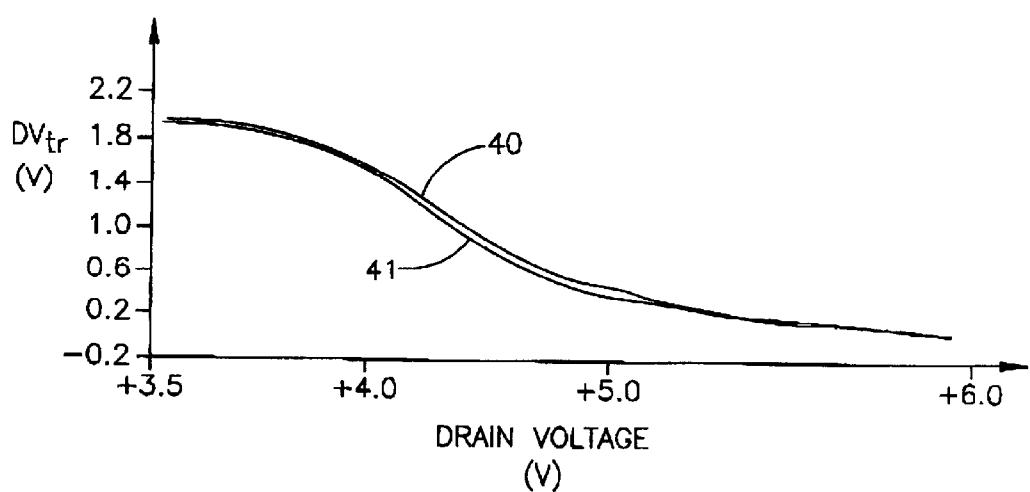

FIGS. 4–6 illustrate the beneficial effects of the reduced surface concentration of the electron acceptor dopant on reducing secondary injection with no adverse effects on operation (programming and erasing) of the NVM device.

Reference is now made to FIG. 4, which illustrates the effect of eliminating the electron acceptor dopant generally near the upper surface of substrate 14, as opposed to the presence of pocket or planar implants, on secondary injection of electrons, normalized to current in the substrate 14 ($I_{sub}$), The curves illustrate the normalized write time, in terms of T*$I_{sub}$ (wherein T is time in seconds and $I_{sub}$ is the substrate current in pA), versus the change in threshold voltage DV$_{tr}$ in volts. To verify that the programming is done by secondary injection, rather than channel hot electron injection, Vds is low (∼−2V) and Vsub is high (∼−4 V). Curve 26 is the normalized write time for a boron pocket implant whose dose is $0.75 \times 10^{13}$ cm$^{-2}$, whereas curve 28 is the normalized write time for no boron pocket implant. It is seen that the presence of the pocket implant (curve 28) increases secondary injection by about two orders of magnitude (i.e., about 100 times more).

Curve 30 is the normalized write time for a boron planar implant (implant over the entire channel with maximum concentration next to the ONO surface) whose dose is $0.8 \times 10^{13}$ cm$^2$, whereas curve 32 is the normalized write time for no boron ply implant It is seen that the presence of the planar implant (curve 30) increase secondary injection by a factor of about 3,000,000 (three million).

The reduction of the electron acceptor dopant generally near the upper surface of substrate 14 may have insignificant or negligible effect on the operation of NVM device 10. For example, reference is now made to FIG. 5, which illustrates the effect of a deep pocket implant of the electron acceptor dopant on programming. The programming parameters may be, for example, without limitation, a gate voltage of 9 V applied for 2 μsec. The change in threshold voltage DV$_{tr}$ is plotted for various drain voltages V$_d$. Curves 34 and 35 are plots of the threshold voltage versus drain voltage for a channel length (L$_d$) of 0.40 μm, respectively with and without a deep boron pocket implant. Curves 36 and 37 are plots of the threshold voltage versus drain voltage for a channel length (L$_d$) of 0.50 μm, respectively with and without a deep boron pocket implant. Curves 38 and 39 are plots of the threshold voltage versus drain voltage for a channel length (L$_d$) of 0.60 μm, respectively with and without a deep boron pocket implant. It is seen that the concentration of electron acceptor dopant deep in a double or triple well has negligible effect on the programmed threshold voltage.

Reference is now made to FIG. 6, which illustrates the effect of a deep pocket implant of the electron acceptor dopant on erasing. The erasing parameters may be, for example, without limitation, a gate voltage of −5 V applied for 250 μsec. The change in threshold voltage DV$_o$ is plotted for various drain voltages V$_d$. Curves 40 and 41 are plots of the threshold voltage versus drain voltage for a channel length (L$_d$) of 0.40 μm, respectively with and without a deep boron pocket implant. It is seen that the concentration of the electron acceptor dopant deep in a double or triple well has negligible effect on the erased threshold voltage.

NROM cells may store more than one bit wherein two individual bits, a left-side bit and a right-side bit, are stored in physically different areas of the charge-trapping region. One of the bits may be read with a read current $I_r$, while the other bit may be read with a reverse current (i.e., in the reverse direction, wherein the roles of drain and source are reversed) $I_{rr}$. It is important to maintain separation between the two bits of a dual-bit NROM cell.

It will be appreciated by persons skilled in the art that the present invention is not limited by what has been particularly shown and described herein above. Rather the scope of the invention is defined by the claims that follow:

What is claimed is:

1. A method for forming a non-volatile memory (NVM) device, the method comprising:
   forming two diffusion areas in a substrate, said diffusion areas forming a channel therebetween, said channel being adapted to permit movement of primary electrons to at least one of said diffusion areas;
   forming a non-conducting charge trapping layer at least over said channel; and
   managing at least one of movement of secondary electrons from said substrate towards said charge trapping layer and a punch-through voltage in said substrate by controlling a position of a concentration of an electron acceptor dopant in said substrate.

2. The method according to claim 1 wherein said managing comprises concentrating less of the electron acceptor dopant generally near an upper surface of said substrate, said upper surface comprising an interface between said substrate and said charge trapping layer, and more of the electron acceptor dopant further from said upper surface of said substrate.

3. The method according to claim 2 wherein said managing comprises concentrating less of the electron acceptor dopant generally near said upper surface of said substrate by concentrating more of an electron donor dopant near said upper surface of said substrate.

4. The method according to claim 3 wherein said electron donor dopant comprises at least one of phosphor and arsenic.

5. The method according to claim 1 wherein said managing comprises concentrating most of the electron acceptor dopant generally between a position half-way from the upper surface and a lower surface of said substrate.

6. The method according to claim 1 and further comprising constructing said substrate with at least one of a double-well and triple-well process.

7. The method according to claim 1 wherein said electron acceptor dopant comprises boron.

8. The method according to claim 1 wherein forming said non-conducting charge trapping layer comprises forming an oxide-nitride-oxide (ONO) layer.

9. A non-volatile memory (NVM) device comprising:
- a channel formed in a substrate;
- two diffusion areas, one on either side of said channel in said substrate, each diffusion area having a junction with said channel, said channel being adapted to permit movement of primary electrons to at least one of said diffusion areas;
- a non-conductive charge trapping layer formed at least over said channel; and
- an electron acceptor dopant concentrated less near an upper surface of said substrate, said upper surface comprising an interface between said substrate and said charge trapping layer, and concentrated more further from said upper surface of said substrate.

10. The device according to claim 9 wherein most of said electron acceptor dopant is concentrated generally between a position half-way from the upper surface and a lower surface of said substrate.

11. The device according to claim 9 wherein said substrate is constructed with at least one of a double-well and triple-well process.

12. The device according to claim 9 wherein an electron donor dopant is concentrated more near said upper surface of said substrate than further from said upper surface of said substrate.

13. The device according to claim 12 wherein said electron donor dopant comprises at least one of phosphor and arsenic.

14. The device according to claim 9 wherein said electron acceptor dopant comprises boron.

15. The device according to claim 9 wherein said non-conducting charge trapping layer comprises an oxide-nitride-oxide (ONO) layer.

16. The device according to claim 9 wherein said electron acceptor dopant is concentrated at at least $1 \times 10^{17}$ cm$^{-2}$ at a depth of 0.1 $\mu$m from the upper surface of said substrate.

17. The device according to claim 9 wherein said electron acceptor dopant is concentrated at at least $10 \times 10^{17}$ cm$^{-2}$ at a depth of between 0.1–0.8 $\mu$m and deeper from the upper surface of said substrate.

18. The device according to claim 9 wherein said electron acceptor dopant is concentrated less than $1 \times 10^{17}$ cm$^{-2}$ at a depth of less than 0.1 $\mu$m.

* * * * *